United States Patent [19]

Kawakami et al.

[11] Patent Number: 5,240,737
[45] Date of Patent: Aug. 31, 1993

[54] METHOD OF MANUFACTURING PRINTED CIRCUIT BOARDS

[75] Inventors: Shin Kawakami; Hirotaka Okonogi; Junichi Ichikawa, all of Saitama, Japan

[73] Assignee: Nippon CMK Corp., Japan

[21] Appl. No.: 734,254

[22] Filed: Jul. 22, 1991

[30] Foreign Application Priority Data

Jul. 24, 1990 [JP] Japan .................. 2-195705

[51] Int. Cl.$^5$ .............................. C23C 26/00
[52] U.S. Cl. ....................... 427/96; 427/97; 427/143; 427/161
[58] Field of Search .............. 427/96, 97, 161, 143

[56] References Cited

U.S. PATENT DOCUMENTS

| | | | |
|---|---|---|---|
| 4,259,391 | 3/1981 | Brecht | 427/161 |
| 4,486,466 | 12/1984 | Leech | 427/97 |
| 4,806,706 | 2/1989 | Machida | 174/68.5 |
| 4,925,705 | 5/1990 | Hill | 427/96 |
| 5,055,342 | 10/1991 | Markovich | 427/96 |
| 5,093,183 | 3/1992 | Strunka | 427/96 |

Primary Examiner—Shrive Beck
Assistant Examiner—Vi Duong Dang
Attorney, Agent, or Firm—Bruce L. Adams; Van C. Wilks

[57] ABSTRACT

In a method of manufacturing printed circuit boards by coating a flux preventive film for preventing a flux from rising on a component surface of an insulation board, the method of manufacturing printed circuit boards according to the present invention is characterized in that said method comprises the steps of printing white blank marks, white blank symbols and white blank letters corresponding to symbol marks, other symbols and letters on the component side surface of said insulation board before coating said flux preventive film, and then coating said flux preventive film of a transparent or translucent material on the printed surface.

13 Claims, 1 Drawing Sheet

METHOD OF MANUFACTURING PRINTED CIRCUIT BOARDS

BACKGROUND OF THE INVENTION

1. Field of the Invention

The present invention relates to a method of manufacturing printed circuit boards. More particularly the present invention relates to a method of manufacturing printed circuit boards formed with a flux preventive film on a component side surface.

2. Description of the Prior Art

Where components are mounted on a prior art printed circuit board, the mounting is performed by soldering component leads to a junction land of the printed circuit board through through-holes thereof.

In order to prevent a flux from rising from the component soldering surface to the component surface during the above-mentioned mounting, a technique has been performed by which the entire surface of the component surface is coated with a flux preventive film. This flux preventive film is by coating a solder resist ink containing silicon and/or fluoroplastics of a prior art solder resist ink by means of silk screen printing. Thus flux preventative film has a surface tension with a contact angle of 100 degrees or more.

SUMMARY OF THE INVENTION

However, this flux preventive film is itself repellant making it difficult to print symbol marks, symbols and letters on the film.

In manufacturing printed circuit boards, a phenolic resin-based copper-clad laminate is usually used and has a light brown color. If the entire surface of the laminate is coated with the flux preventive film, for example, with a flux preventive film with a green color and the like, the resulting color is a mixed color of green with light brown having a disadvantage of darkened tone, thereby deteriorating the appearance of the circuit board.

Accordingly, the present invention has been developed to eliminate the disadvantage of the prior art. An object of the present invention is to provide a method of manufacturing printed circuit boards capable of printing symbol marks, symbols and other letters regardless of the characteristic (in particular, repellency) of a flux preventive film applied to the component side surface of printed circuit boards, and capable of coating the flux preventive film without diminishing the appearance.

In a method of manufacturing printed circuit boards by coating a flux preventive film for preventing a flux from rising on a component surface of an insulation board, the method of manufacturing printed circuit boards according to the present invention includes the steps of printing white blank marks, white blank symbols and white blank letters corresponding to symbol marks, other symbols and letters on the component side surface of an insulation board before coating the flux preventive film. Then coating a flux preventive film comprising a transparent or translucent material on the printed surface.

According to the present invention, white blank marks, white blank symbols or white blank letters corresponding to symbol marks, symbols or letters are printed, and then the printed surface is coated with a flux preventive film comprising a transparent or translucent material, whereby the flux preventive effect can be maintained while making the marks, symbols and letters legible, and the color of the marks, symbols and letters correspond to that of the flux preventive film coated surface of printed circuit boards which can be freely selected. Thus improving the appearance of the color of the printed circuit boards.

DESCRIPTION OF THE EMBODIMENTS

With reference to drawings, an embodiment of a method of manufacturing printed circuit boards according to the present invention will be explained.

Figure 1:
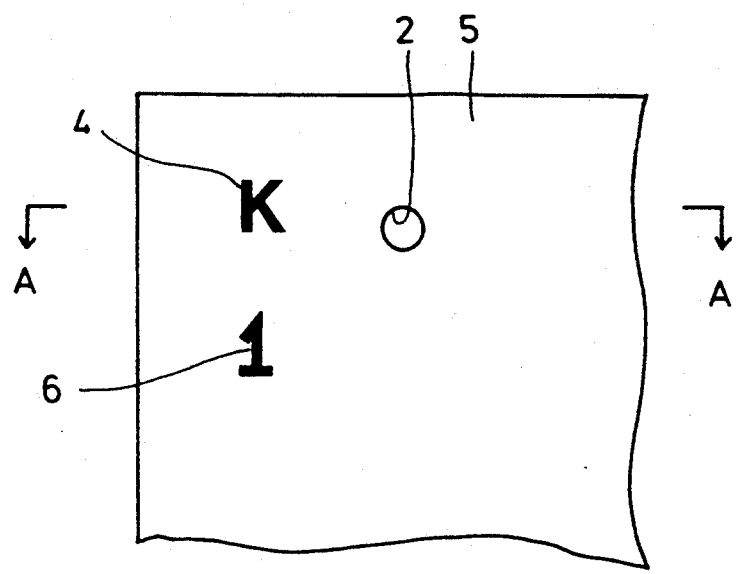
FIG. 1 is an illustrative view showing a method of manufacturing printed circuit boards according to the present invention.
Figure 2:
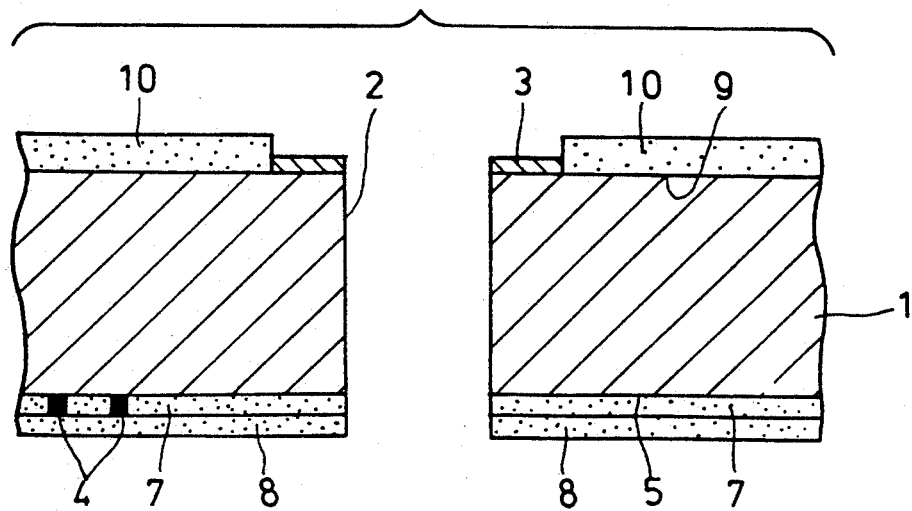
FIG. 2 is an expanded sectional view taken along the line A—A of FIG. 1.

FIG. 1 is an illustrative view showing a method of manufacturing printed circuit boards according to the present invention, and FIG. 2 is an expanded sectional view taken along the line A—A of FIG. 1.

First, a component-mounting hole 2 corresponding to a required printed circuit is punched or drilled in a phenolic resin-based copper-clad laminate, and then the required printed circuit is formed on a printed circuit surface and a junction land 3 for component leads is formed.

Thereafter, indicia such as white blank letters 4 and 6 as symbol marks or symbols are printed using an ordinary solder resist ink on a component surface 5 of a substrate such as an insulation board 1.

Then, the entire surface of an indicia printed surface 7 of the white blank letters 4 and 6 is coated with a flux preventive film 8 by means of silk screen printing using a transparent or translucent special ink. This ink is light transmissive and is produced by mixing a paint consisting mainly of an ordinary solder resist ink with a proper quantity of silicon and/or fluoroplastics (a quantity by which a normal contact angle becomes 100 degrees or more).

Also, a printed circuit surface of the insulation board 1 is coated with a solder resist 10 after the printed circuit is formed.

Although the entire surface of the printed surface of the white blank letters 4 and 6 is coated with the flux preventive film 8, the flux preventive film 8 is transparent or translucent, whereby the white blank letters 4 and 6 are sufficiently legible, and can be protected with the flux preventive film 8.

Further, the flux preventive film 8 prevents a flux from rising from the printed circuit surface 9 and adhering to the indicia printed surface of the component surface 5.

According to the present invention, symbol marks, symbols and letters can be printed on a printed circuit board having a flux preventive film, and the color of the flux preventive film-coated surface on the printed circuit board can be arranged in a manner to become a bright color by selecting the color of the printing ink for the symbol marks, symbols and letters, thereby improving the external appearance thereof.

What is claimed is:

1. A method of manufacturing a printed circuit board, comprising the steps of: providing an insulative substrate; forming a printed circuit on a printed circuit surface of the substrate; printing indicia on an indicia printed surface of the substrate; and coating a light-transmissive flux preventive film on the indicia printed surface of the substrate over at least the indicia such that the indicia are legible through the light-transmissive flux preventive film.

2. A method of manufacturing a printed circuit board according to claim 1; wherein the indicia are printed using a solder resist ink.

3. A method of manufacturing a printed circuit board according to claim 1; wherein the light-transmissive flux preventive film is transparent.

4. A method of manufacturing a printed circuit board according to claim 1; wherein the light-transmissive flux preventive film is translucent.

5. A method of manufacturing a printed circuit board according to claim 1; wherein the light-transmissive flux preventive film comprises a solder resist ink mixed with at least one of silicon and a fluoroplastic.

6. A method of manufacturing a printed circuit board according to claim 5; wherein the coated light-transmissive flux preventive film has a contact angle of at least 100 degrees.

7. A method of manufacturing a printed circuit board according to claim 1; wherein the printed circuit surface and the indicia printed surface are on opposite sides of the substrate.

8. A method of manufacturing a printed circuit board according to claim 7; further comprising forming a component lead mounting hole in the substrate; and the coating step comprises coating the light-transmissive flux preventive film so as to prevent flux from the component lead mounting hole from adhering to the indicia printed surface.

9. A method of manufacturing a printed circuit board according to claim 1; wherein the light-transmissive flux preventive film is coated by silk screening.

10. A method of manufacturing a printed circuit board according to claim 1; wherein the light-transmissive flux preventive film is coated on the entire indicia printed surface of the substrate.

11. A method of manufacturing a printed circuit board according to claim 1; further comprising forming a solder resist layer on the printed circuit.

12. A method of manufacturing a printed circuit board according to claim 1; wherein the substrate is an insulation board.

13. A method of manufacturing a printed circuit board, comprising the steps of: providing an insulation board substrate having a printed circuit surface on one side and an indicia printed surface on the other side; forming a component lead mounting hole through the substrate; forming a printed circuit on the printed circuit surface; printing indicia using a solder resist ink on the indicia printed surface; and coating a light-transmissive flux preventive film on the entire indicia printed surface, the light-transmissive flux preventive film comprising a solder resist ink mixed with at least one of silicon and a fluoroplastic so as to be light-transmissive to permit the indicia to be legible therethrough and the light-transmissive flux preventive film being effective to prevent flux from the component lead mounting hole from adhering to the indicia printed surface.

* * * * *